United States Patent
Shinoda

(10) Patent No.: US 7,955,765 B2
(45) Date of Patent: Jun. 7, 2011

(54) ADJUSTMENT METHOD, EXPOSURE METHOD, DEVICE MANUFACTURING METHOD, AND EXPOSURE APPARATUS

(75) Inventor: Ken-ichiro Shinoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 312 days.

(21) Appl. No.: 12/177,557

(22) Filed: Jul. 22, 2008

(65) Prior Publication Data

US 2009/0035671 A1 Feb. 5, 2009

(30) Foreign Application Priority Data

Jul. 30, 2007 (JP) ................................. 2007-197849

(51) Int. Cl.
*G03F 9/00* (2006.01)
(52) U.S. Cl. ........................................................ 430/30
(58) Field of Classification Search ...................... 430/30
See application file for complete search history.

(56) References Cited

U.S. PATENT DOCUMENTS

| 6,768,546 B2 | 7/2004 | Sato |
| 7,245,356 B2 * | 7/2007 | Hansen ........................... 355/67 |
| 7,643,137 B2 * | 1/2010 | Sugihara et al. ........... 356/237.2 |
| 2003/0038937 A1 | 2/2003 | Sato |
| 2007/0046922 A1 | 3/2007 | Kadono |

FOREIGN PATENT DOCUMENTS

| JP | 11-317349 A | 11/1999 |
| JP | 2007-059566 A | 3/2007 |
| JP | 2007-188927 A | 7/2007 |
| KR | 10-2004-0005709 A | 1/2004 |

* cited by examiner

*Primary Examiner* — Christopher G Young
(74) *Attorney, Agent, or Firm* — Canon USA, Inc. IP Division

(57) ABSTRACT

An adjustment method for adjusting an illumination condition in illuminating an original plate using an illumination optical system and projecting an image of a pattern formed on the original plate onto a substrate through a projection optical system includes measuring a polarization state of light that has passed through the illumination optical system, the original plate, and the projection optical system in a state where the original plate is located on an object plane of the projection optical system, and adjusting the polarization state based on the measured polarization state.

9 Claims, 12 Drawing Sheets

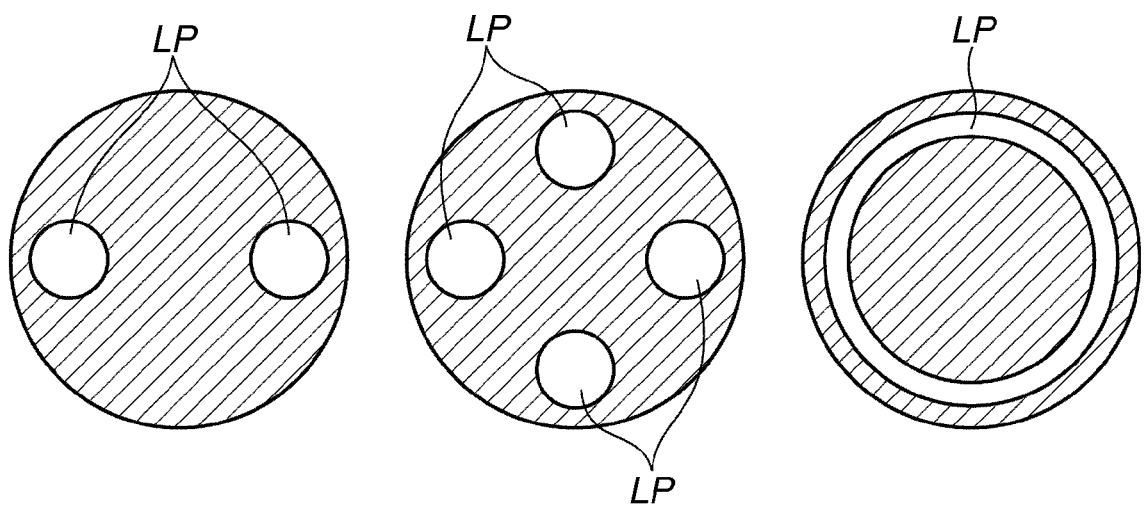

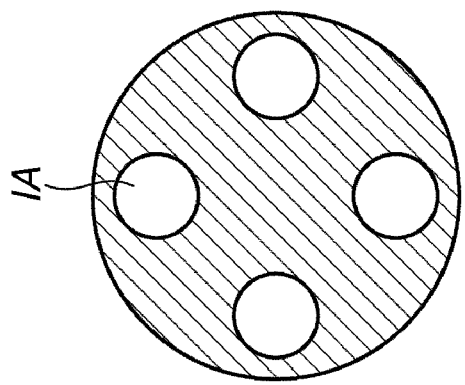
FIG.3A
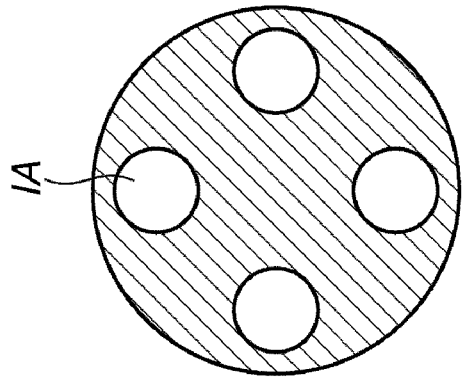
FIG.3B
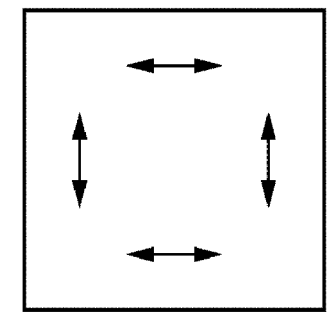
FIG.3C
LIGHT QUANTITY DISTRIBUTION
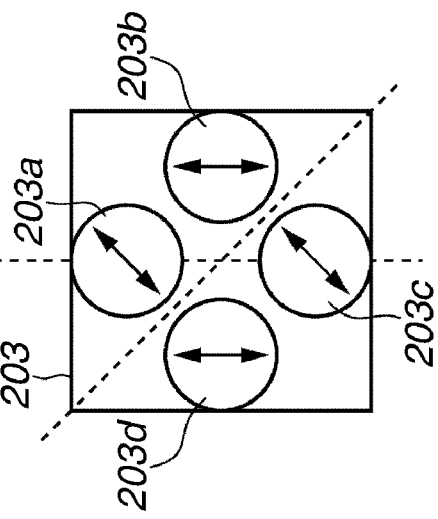
POLARIZATION STATE

FAST-AXIS DIRECTION OF PHASE PLATE

POLARIZATION STATE OF EFFECTIVE LIGHT SOURCE DISTRIBUTION

FIG.5A FIG.5B
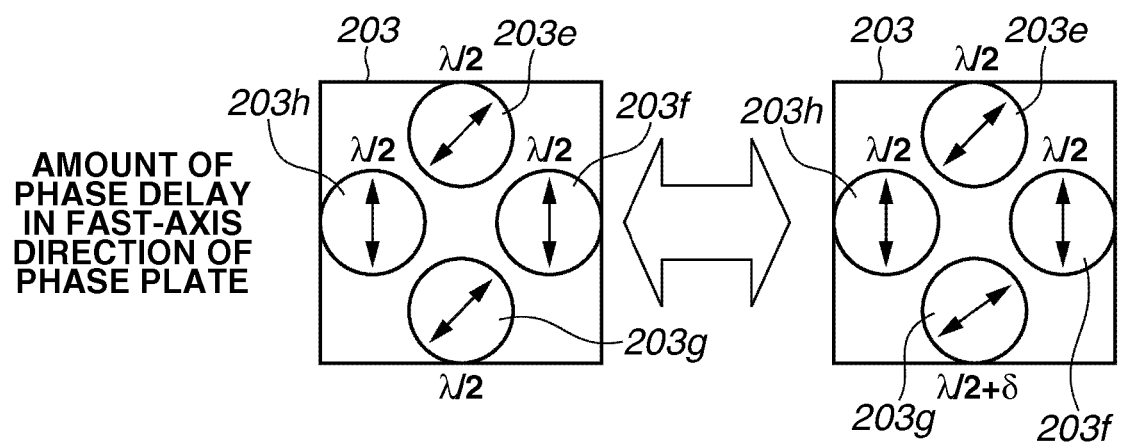
AMOUNT OF PHASE DELAY IN FAST-AXIS DIRECTION OF PHASE PLATE
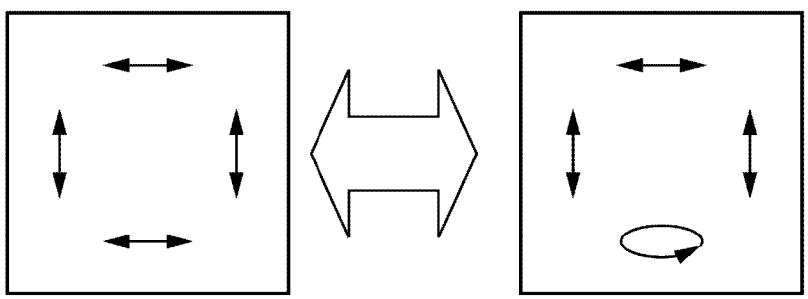
POLARIZATION STATE OF EFFECTIVE LIGHT SOURCE DISTRIBUTION

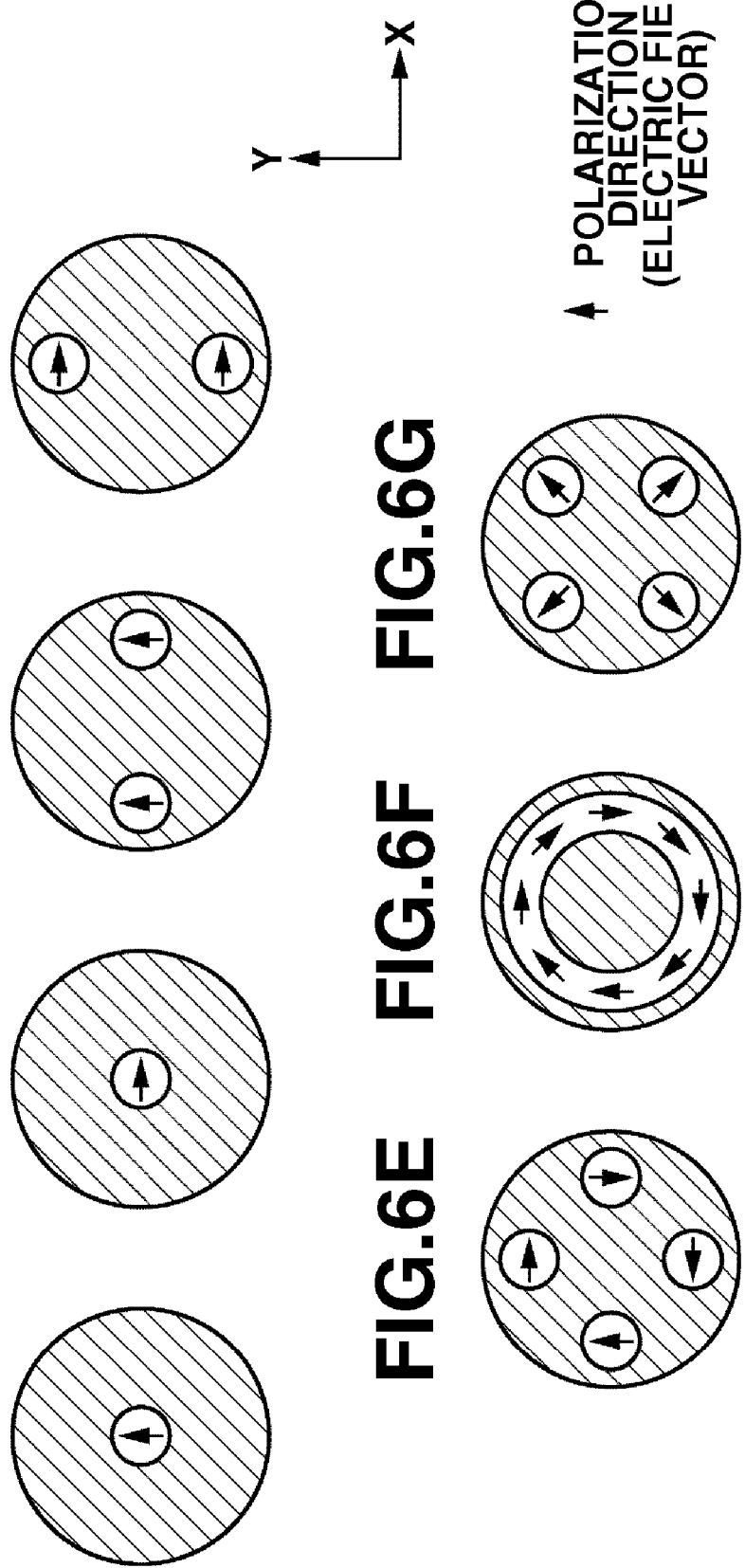

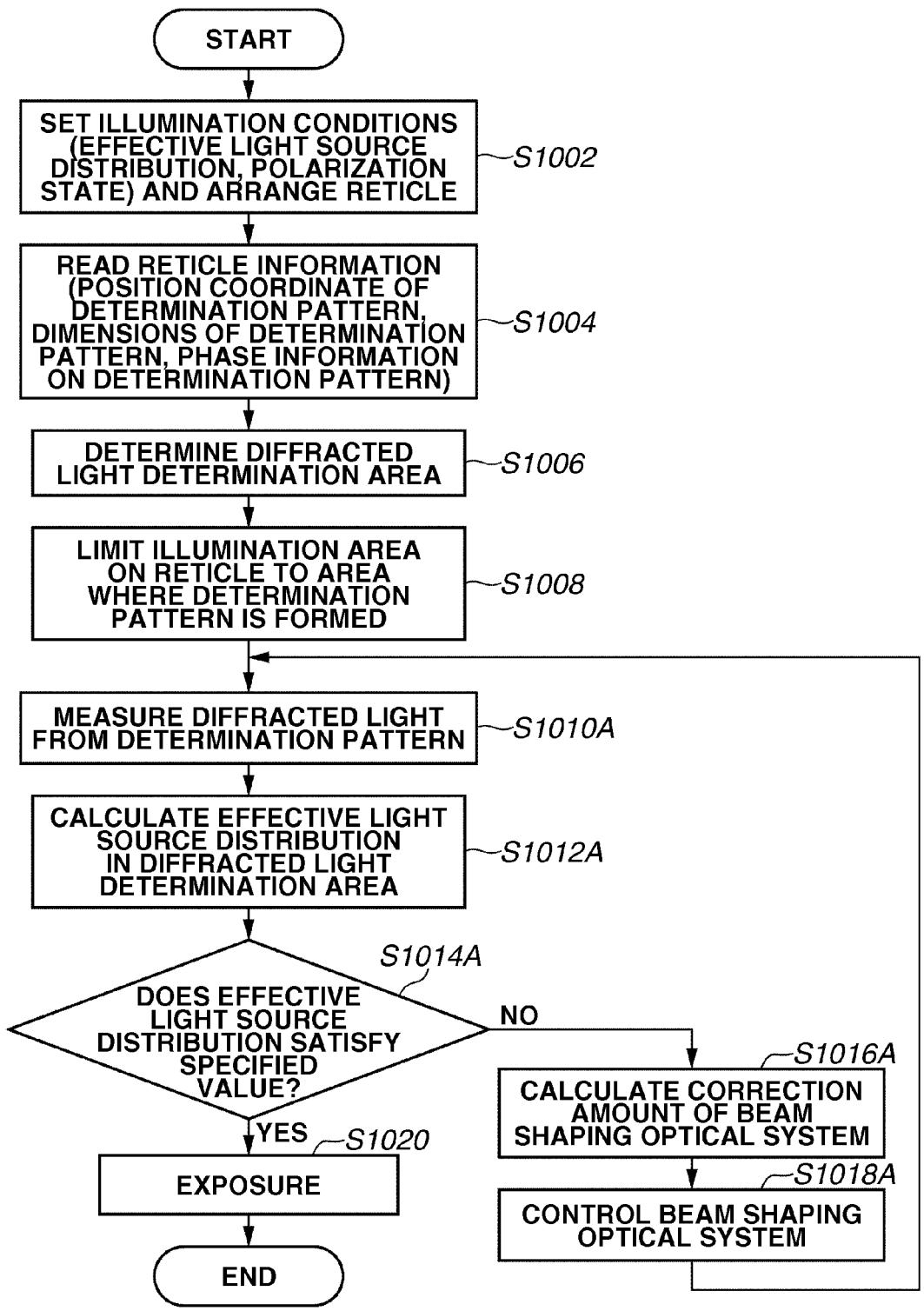

ADJUSTMENT METHOD, EXPOSURE METHOD, DEVICE MANUFACTURING METHOD, AND EXPOSURE APPARATUS

BACKGROUND OF THE INVENTION

1. Field of the Invention

The present invention relates to an adjustment method, an exposure method, a device manufacturing method, and an exposure apparatus.

2. Description of the Related Art

Conventionally, a projection exposure apparatus configured to project a circuit pattern formed on a reticle (mask) onto a wafer using a projection optical system to transfer the circuit pattern is used in manufacturing a semiconductor device employing photolithography techniques.

There are three important factors in determining the exposure performance of a projection exposure apparatus: resolution, overlay accuracy, and throughput. In recent years, resolution is especially attracting attention in relation with the development of increased numerical aperture (NA), which has become feasible with the use of an immersion projection optical system. Increased NA in a projection optical system leads to an increased angle between the perpendicular to an image plane and the traveling direction of incident light. This is referred to as high NA imaging.

In high NA imaging, the polarization state of exposure light becomes important. For example, light that has a polarization direction parallel to a repetitive pattern (e.g., repetitive line-and-space pattern) is referred to as s-polarized light, and light that has a polarization direction perpendicular to the repetitive pattern is referred to as p-polarized light. In the case where the angle defined by interference light beams is 90 degrees, since interference occurs with s-polarized light, s-polarized light can form a light intensity distribution corresponding to the pattern on an image plane. On the other hand, since interference does not occur with p-polarized light, p-polarized light forms a uniform light intensity distribution and, thus, cannot form a light intensity distribution corresponding to the pattern on the image plane. If exposure light contains both s-polarized light and p-polarized light, then a light intensity distribution with inferior contrast is formed compared to when exposure light contains only s-polarized light. If the percentage of p-polarized light increases, then the contrast of a light intensity distribution on the image plane decreases, thus resulting in no transfer of the pattern.

Accordingly, it is necessary to improve the contrast by controlling the polarization state of exposure light. Controlling polarization of exposure light enables a light intensity distribution with sufficient contrast to be formed on an image plane. Accordingly, a finer pattern can be formed on the image plane.

Polarization of exposure light can be controlled by controlling the polarization state on a pupil plane in an illumination optical system. However, even if the polarization state on a pupil plane in the illumination optical system is controlled, the controlled polarization state is not always maintained on the image plane. This is because an optical system subsequent to the pupil plane in the illumination optical system or a projection optical system exerts an influence on the polarization state.

For example, in order to improve transmittance or reflectance, an antireflection film may be formed on a lens or a high-reflectance film may be formed on a reflection mirror. However, the transmittance and reflectance of these films depend on a polarization direction. When a phase difference is applied to the films, the polarization state on the image plane may be changed. Further, according to the use of a light source having shorter wavelength as exposure light, quartz or fluorite may be used as a lens material. Such a member causes a change in polarization state due to its birefringence. Further, according to stress caused by a mechanical member, such as a lens barrel, that holds the lens material, birefringence of the lens material may be changed.

Accordingly, a polarization state in an exposure apparatus as a whole needs to be measured. Japanese Patent Application Laid-Open No. 2007-59566 discusses an exposure apparatus that is capable of measuring the polarization state of an illumination optical system or a projection optical system.

However, the exposure apparatus discussed in Japanese Patent Application Laid-Open No. 2007-59566 does not measure the polarization state of an illumination optical system or a projection optical system in a state where a reticle is set on a reticle stage. In other words, the exposure apparatus does not measure the polarization state in a state where the reticle is located between the illumination optical system and the projection optical system. Since actual exposure is performed with the reticle set between the illumination optical system and the projection optical system, the polarization state may be changed due to the birefringence of the reticle itself or to the stress birefringence caused when the reticle is held. Accordingly, although the exposure apparatus discussed in Japanese Patent Application Laid-Open No. 2007-59566 measures the polarization state of the illumination optical system or the projection optical system, the measured polarization state is not the polarization state under the actual exposure conditions.

SUMMARY OF THE INVENTION

The present invention is directed to an adjustment method for adjusting illumination conditions by measuring a polarization state under an actual exposure condition.

According to an aspect of the present invention, an adjustment method for adjusting an illumination condition in illuminating an original plate using an illumination optical system and projecting an image of a pattern formed on the original plate onto a substrate through a projection optical system includes measuring a polarization state of light that has passed through the illumination optical system, the original plate, and the projection optical system in a state where the original plate is located on an object plane of the projection optical system, and adjusting the polarization state based on the measured polarization state.

According to another aspect of the present invention, an exposure apparatus includes an illumination optical system configured to illuminate an original plate using light emitted from a light source, a projection optical system configured to project a pattern formed on the original plate onto a substrate, a polarization conversion unit configured to convert a polarization state of the light emitted from the light source, a measurement unit configured to measure a polarization state of light on an image plane of the projection optical system, and a control unit configured to control the polarization conversion unit based on a measurement result obtained by the measurement unit. The measurement unit measures a polarization state of light that has passed through the illumination optical system, the original plate, and the projection optical system in a state where the original plate is located on an object plane of the projection optical system.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 2A through 2C each illustrate an example of effective light source distribution formed by a beam shaping optical system of the exposure apparatus illustrated in FIG. 1.

FIGS. 3A through 3C illustrate a polarization state before and after light passes through a phase plate of the exposure apparatus illustrated in FIG. 1.

FIGS. 5A and 5B illustrate a relation between a phase difference of the phase plate of the exposure apparatus illustrated in FIG. 1 and a polarization state of effective light source distribution.

FIGS. 6A through 6G each illustrate an example of a polarization state on a pupil plane in an illumination optical system of the exposure apparatus illustrated in FIG. 1.

FIG. 15 is a flowchart illustrating an exposure method according to an exemplary embodiment of the present invention.

DETAILED DESCRIPTION OF THE EMBODIMENTS

Various exemplary embodiments, features, and aspects of the invention will now be described in detail with reference to the drawings.

Figure 1:
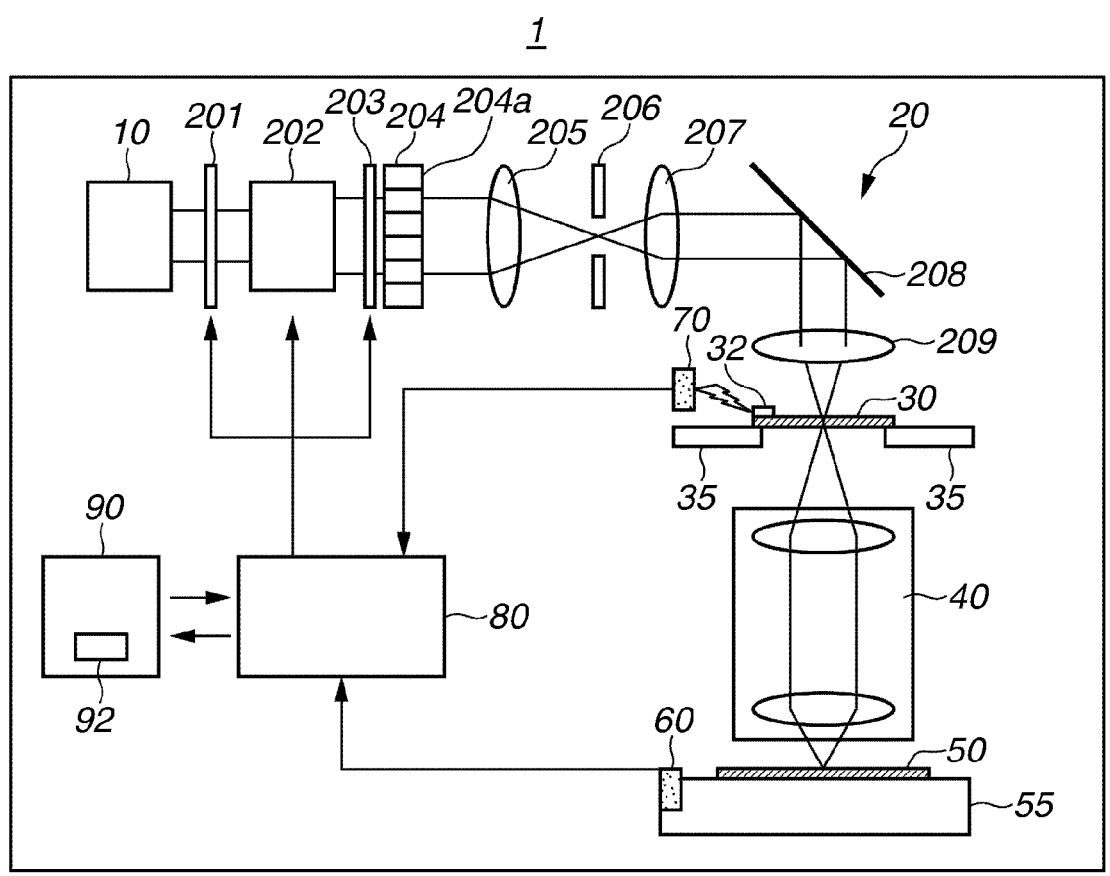
FIG. 1 is a block diagram illustrating a configuration of an exposure apparatus according to an exemplary embodiment of the present invention.

FIG. 1 is a block diagram illustrating a configuration of an exposure apparatus according to an exemplary embodiment of the present invention. According to the present exemplary embodiment, the exposure apparatus 1 is a projection exposure apparatus configured to project a pattern formed on a reticle (original plate) 30 onto a wafer (substrate) 50 using a step-and-scan method. However, a projection exposure apparatus using a step-and-repeat method or other exposure methods can also be used for the exposure apparatus 1.

The exposure apparatus 1 includes a light source 10, an illumination optical system 20, a reticle stage 35 configured to support the reticle 30, a projection optical system 40, a wafer stage 55 configured to support the wafer 50, a measurement unit 60, a reading unit 70, a control unit 80, and a determination unit 90.

As the light source 10, for example, a krypton fluoride (KrF) excimer laser with a wavelength of 248 nm or an argon fluoride (ArF) excimer laser with a wavelength of 193 nm is used. The light source 10 is not limited to excimer lasers, and a molecular fluorine (F2) laser light source of a 157 nm-wavelength can also be used. Light (laser beam) emitted from the light source 10 is approximately linear polarized light. Light emitted from the light source 10 is changed into a desired polarization state by a $\lambda/2$ waveplate (phase plate) 201 and a phase plate (wave plate) 203, which will be described in detail below, and directed onto the reticle 30. According to the present exemplary embodiment, light emitted from the light source 10 is described as approximately linear polarized light having an electric field vector oriented in a direction perpendicular to the drawing surface of FIG. 1.

The illumination optical system 20 is configured to illuminate the reticle 30 using light emitted from the light source 10. According to the present exemplary embodiment, the illumination optical system 20 includes the $\lambda/2$ waveplate 201, a beam shaping optical system 202, the phase plate 203, a fly-eye lens 204, a condenser lens 205, a masking blade 206, relay optical systems 207 and 209, and a folding mirror 208. An optical integrator, for example, a microlens array can be used in place of the fly-eye lens 204.

The $\lambda/2$ waveplate 201 is controlled by the control unit 80, which will be described in detail below. The $\lambda/2$ waveplate 201 is removably arranged in an optical path of the illumination optical system 20. The $\lambda/2$ waveplate 201 collectively adjusts or changes the polarization state of light emitted from the light source 10. According to the present exemplary embodiment, the $\lambda/2$ waveplate 201 is arranged such that a fast-axis direction of the $\lambda/2$ waveplate 201 is at an angle of 45 degrees with respect to the polarization direction of light emitted from the light source 10.

By setting the $\lambda/2$ waveplate 201 in the optical path of the illumination optical system 20 or removing the $\lambda/2$ waveplate 201 from the optical path of the illumination optical system 20, the polarization state of light incident on an optical system of the subsequent stage can be either switched to linear polarized light having an electric field vector oriented in a direction perpendicular to the drawing sheet surface or to linear polarized light having an electric field vector oriented in a direction parallel to the drawing sheet surface. However, instead of configuring the $\lambda/2$ waveplate 201 so that it can be set in the optical path or can be removed from the optical path, the $\lambda/2$ waveplate 201 can be configured to be rotatable. If the $\lambda/2$ waveplate 201 is configured to be rotatable, the fast-axis direction of the $\lambda/2$ waveplate 201 can be changed to a direction parallel to the polarization direction of light emitted from the light source 10 or to a direction at an angle of 45 degrees with respect to light emitted from the light source 10, and accordingly a similar effect can be obtained.

The beam shaping optical system 202 functions as a light intensity generation unit configured to form a light intensity distribution (effective light source) on the pupil plane of the illumination optical system 20. The beam shaping optical system 202 provides, for example, effective light source distributions illustrated in FIGS. 2A through 2C. The effective light source distribution illustrated in FIG. 2A is a dipole illumination having light portions LP in two off-axis areas on the pupil plane of the illumination optical system 20. The effective light source distribution illustrated in FIG. 2B is a quadrupole illumination having light portions LP in four off-axis areas on the pupil plane of the illumination optical system 20. The effective light source distribution illustrated in FIG. 2C is an annular illumination having a light portion LP in an off-axis annular area on the pupil plane of the illumination optical system 20. FIGS. 2A through 2C illustrate examples of effective light source distributions formed by the beam shaping optical system 202.

The phase plate 203 is controlled by the control unit 80, which will be described in detail below. The phase plate 203 is removably arranged in an optical path of the illumination optical system 20. The phase plate 203 functions as a polarization conversion unit configured to convert the polarization state of light emitted from the light source 10 and to form a desired polarization state on the pupil plane of the illumination optical system 20. Although the λ/2 waveplate 201 collectively changes the polarization state of the light emitted from the light source 10, the phase plate 203 makes partial adjustment to the polarization state on the pupil plane of the illumination optical system 20. However, the phase plate 203 does not necessarily perform adjustment of the polarization state on the pupil plane of the illumination optical system 20. The phase plate 203 may adjust the polarization state of light emitted from the light source 10 into a desired polarization state in a stage after the pupil plane of the illumination optical system 20 but before the reticle 30.

Next, a polarization state of light before and after the phase plate 203 will be described with reference to FIGS. 3A through 3C. FIGS. 3A through 3C illustrate the polarization state of light before and after the phase plate 203. According to the present exemplary embodiment, an effective light source distribution having a quadrupole illumination illustrated in FIG. 2B is formed by the beam shaping optical system 202. The light quantity distributions before and after the phase plate 203 in this case are illustrated in the upper portions of FIG. 3A and 3C. As can be seen, the light quantity distribution includes four light areas IA corresponding to the four light portions LP of the effective light source distribution illustrated in FIG. 2B.

Light emitted from the light source 10 is converted into a uniform polarization state by the λ/2 waveplate 201. For example, suppose the polarization state of light emitted from the light source 10 is converted into a polarization state having an electric field vector oriented in the vertical direction by the λ/2 waveplate 201 as illustrated in FIG. 3A. Further, suppose four phase plates 203 or four phase plates 203a through 203d are arranged in four areas corresponding to the light areas IA (the light portions LP in the effective light source distribution area) illustrated in FIG. 3B. Each of the phase plates 203a and 203c is a λ/2 waveplate with its fast axis oriented 45 degrees from the vertical direction. Each of the phase plates 203b and 203d is a λ/2 waveplate with its fast axis oriented in the vertical direction.

When light emitted from the light source 10 passes through the phase plate 203 illustrated in FIG. 3B, since the polarization direction of light incident on the light areas IA on the upper and lower parts of the light quantity area is rotated 90 degrees by the phase plates 203a and 203c, the polarization state becomes as illustrated in FIG. 3C with the polarization direction in the horizontal direction. On the other hand, since the polarization direction of light incident on the light areas IA on the right and left parts of the light quantity area is parallel to the fast axis of the phase plates 203b and 203d, the polarization direction is unchanged, and thus the polarization state becomes as illustrated in FIG. 3C with the polarization direction in the vertical direction. Accordingly, light that has passed through the phase plate 203 has a quadrupole light intensity distribution with a different polarization state for each area.

According to the present exemplary embodiment, the phase plate 203 includes a rotation mechanism configured to allow independent rotation (drive) of the phase plates 203a through 203d. Since the control unit 80 is capable of controlling the rotation mechanism of the phase plate 203, partial adjustment of the polarization state on the pupil plane of the illumination optical system 20 can be independently performed.

Figure 4A:
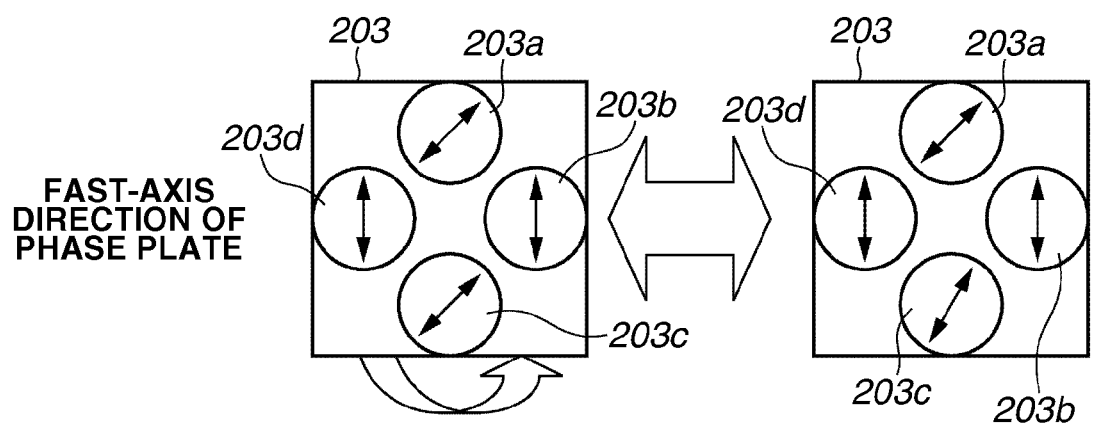
FIGS. 4A and 4B illustrate a relation between a fast-axis direction of the phase plate of the exposure apparatus illustrated in FIG. 1 and a polarization state of effective light source distribution.
Figure 4B:
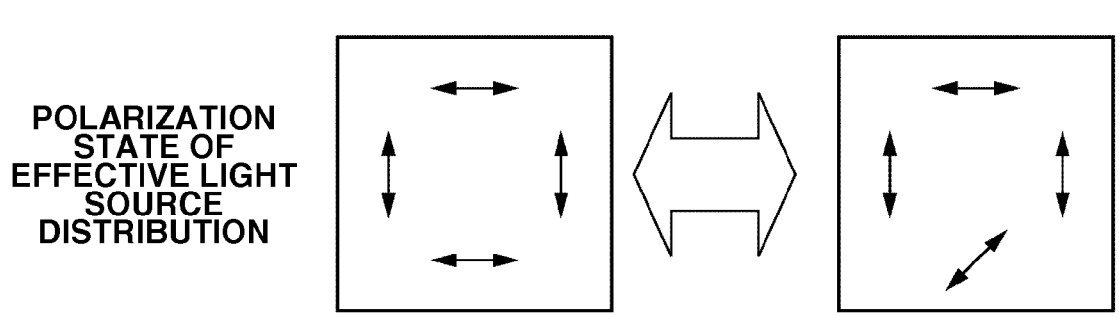

If the phase plate 203c in a position illustrated in the upper portion of FIG. 4A is rotated by the rotation mechanism, the fast-axis direction can be changed as illustrated in the upper portion of FIG. 4B. As illustrated in the lower portions of FIGS. 4A and 4B, the polarization state of an area corresponding only to the phase plate 203c can be changed. By making the fast-axis directions of the phase plates 203a through 203d changeable for each area on the pupil plane of the illumination optical system 20, the polarization direction of the effective light source distribution can be changed. FIGS. 4A and 4B illustrate the fast-axis directions of the phase plates 203a through 203d and the polarization states of the effective light source distribution.

According to the effective light source distribution illustrated in FIG. 2B, light from the light portions LP on the upper and lower parts contributes to the image formation of a pattern in the horizontal direction and light from the light portions LP on the right and left parts contributes to the image formation of a pattern in the vertical direction. Thus, in the case described above referring to FIGS. 4A and 4B, the light intensity of s-polarized light in the light portion LP at the lower part of the effective light source distribution with respect to the horizontal pattern is decreased (or the light intensity of p-polarized light is increased).

In this way, by performing partial and independent adjustment of the polarization state on the pupil plane of the illumination optical system 20, various polarization states can be formed. According to the present exemplary embodiment, although phase plates 203a through 203d are rotated independently in each area in the effective light source distribution to adjust the polarization state, the entire phase plate 203 can also be rotated.

It is to be noted that, although the phase plates 203a through 203d are rotated to change the fast-axis directions of the phase plates 203a through 203d in FIGS. 4A and 4B, a similar effect can be obtained by shifting the phase difference from $\pi(\lambda/2)$.

For example, as illustrated in the upper portion of FIG. 5A, the phase plate 203 includes phase plates 203e through 203h that can provide a phase difference of $\pi(\lambda/2)$ in a field oscillation direction (plane of polarization) of incident light. According to the present exemplary embodiment, if the phase plate 203 is in a state as illustrated in the upper portion of FIG. 5A, the effective light source distribution is in a polarization state as illustrated in the lower portion of FIG. 5A. As illustrated in the upper portion of FIG. 5B, if the phase difference of the phase plate 203g is shifted from $\pi(\lambda/2)$ (phase difference will be $\pi(\lambda/2)+\delta$), then, as illustrated in the lower portion of FIG. 5B, the polarization state of an area corresponding only to the phase plate 203g can be changed. Thus, by shifting the magnitude of the phase difference of phase plates 203e through 203h from $\pi(\lambda/2)$, various polarization states can be formed. FIGS. 5A and 5B illustrate a relation between phase differences of the phase plates 203e through 203h and polarization states of the effective light source distribution.

FIGS. 6A through 6G illustrate examples of the polarization state on the pupil plane of the illumination optical system 20. In FIGS. 6A through 6G, polarized light having an electric field vector in the X direction is referred to as X-polarized light and polarized light having an electric field vector in the Y direction is referred to as Y-polarized light.

FIG. 6A illustrates Y-polarized small σ illumination. The Y-polarized small σ illumination is effective when a repetitive pattern in the X direction is transferred onto the reticle 30 using a Levenson alternating phase shift mask (Alt-PSM).

FIG. 6B illustrates X-polarized small σ illumination. The X-polarized small σ illumination is effective when a repetitive pattern in the Y direction is transferred onto the reticle 30 using the Alt-PSM.

FIG. 6C illustrates Y-polarized X-dipole illumination. The Y-polarized X-dipole illumination is effective when a repetitive pattern in the X direction is transferred onto the reticle 30 using a binary mask or a half tone mask (attenuated phase shift mask: Att-PSM).

FIG. 6D illustrates X-polarized Y-dipole illumination. The X-polarized Y-dipole illumination is effective when a repetitive pattern in the Y direction is transferred onto the reticle 30 using the binary mask or the Att-PSM.

FIG. 6E illustrates tangentially-polarized cross-pole illumination. The tangentially-polarized cross-pole illumination is effective when a repetitive pattern in both the X and the Y directions is transferred onto the reticle 30 using the binary mask or the Att-PSM.

FIG. 6F illustrates tangential annular illumination. The tangential annular illumination is effective when a repetitive pattern in various directions is transferred onto the reticle 30 using the binary mask or the Att-PSM. The tangentially-polarized illumination is a mode of illumination where an electric field vector is in a direction substantially perpendicular to a direction towards the center of the optical axis (radial direction) and in a circumferential direction at each point on the pupil plane of the illumination optical system 20.

FIG. 6G illustrates 45-degrees radial-polarized quadrupole illumination. The 45-degrees radial-polarized quadrupole illumination is effective when a contact hole pattern is transferred to the reticle 30 using a chrome-less phase shift mask (Cr-less PSM). The radial polarization is a polarization state where the electric field vector is directed towards the center of the optical axis at each point on the pupil plane of the illumination optical system 20.

Now, referring back to FIG. 1, the fly-eye lens 204 divides the wave front of light emitted from the light source 10 to form a great number of secondary light sources. According to the present exemplary embodiment, a vicinity of an exit surface 204a of the fly-eye lens 204 is the pupil plane of the illumination optical system 20, and the light intensity distribution on the exit surface 204a of the fly-eye lens 204 is referred to as an effective light source.

The condenser lens 205 directs light beams from the secondary light sources formed in the vicinity of the exit surface 204a of the fly-eye lens 204 to the position of the masking blade 206. In this way, a uniform light intensity distribution can be obtained.

The relay optical systems 207 and 209 optically conjugate the masking blade 206 and the reticle 30 through the folding mirror 208, which deflects light.

The reticle 30 includes a circuit pattern for a device and is supported and driven by the reticle stage 35. Diffracted light from the reticle 30 is projected onto the wafer 50 through the projection optical system 40. Since the exposure apparatus 1 is a step-and-scan exposure apparatus, the exposure apparatus 1 transfers the pattern formed on the reticle 30 onto the wafer 50 by scanning the reticle 30 and the wafer 50.

Further, the reticle 30 includes reticle information (original plate information) 32 indicating information on the pattern (circuit pattern) formed on the reticle 30. According to the present exemplary embodiment, the reticle information 32 is provided on the reticle 30 in the form of a bar code. However, the reticle information 32 can be provided in a different form so long as it functions as an identifier capable of identifying the pattern formed on the reticle 30. Details of the reticle information 32 will be described in detail below.

The reticle stage 35 mounts the reticle 30 between the illumination optical system 20 and the projection optical system 40 (object plane of the projection optical system 40). The reticle stage 35 is controlled by the control unit 80, which will be described in detail below, and positions the reticle 30. The reticle stage 35 supports the reticle 30 and moves the reticle 30 in the X-, the Y-, and the Z-axis directions as well as in rotation directions of the axes, for example, using linear motors. According to the present exemplary embodiment, the scan direction in a surface plane of the reticle 30 or the wafer 50 is referred to as the Y-axis direction, a direction perpendicular to the Y-axis direction is referred to as the X-axis direction, and a direction perpendicular to the surface plane of the reticle 30 or the wafer 50 is referred to as the Z-axis direction.

The projection optical system 40, which is arranged between the reticle stage 35 (or the reticle 30) and the wafer stage 55 (or the wafer 50), is configured to project a pattern formed on the reticle 30 onto the wafer 50. A dioptric system, a catadioptric system, or a catoptric system can be used for the projection optical system 40.

The wafer 50 is a substrate onto which a pattern formed on the reticle 30 is to be projected or transferred. The wafer 50 can be replaced with a glass plate or other substrates. Photoresist is coated on the wafer 50.

The wafer stage 55 supports the wafer 50. Like the reticle stage 35, the wafer stage 55 moves the wafer 50 in the X-, the Y-, and the Z-axis directions as well as in rotation directions of the axes using linear motors.

According to the present exemplary embodiment, the measurement unit 60 is mounted on the wafer stage 55 and measures light in the vicinity of the image plane of the projection optical system 40, on which the wafer 50 is located, to be more precise, light projected onto the wafer 50. According to the present exemplary embodiment, the measurement unit 60 measures at least one of the polarization state of diffracted light from the reticle 30 (light that has passed through the illumination optical system 20, the reticle 30, and the projection optical system 40) and the light intensity distribution of diffracted light from the reticle 30 (light intensity distribution on the pupil plane of the projection optical system 40). The light intensity distribution on the pupil plane of the projection optical system 40 corresponds to the angular distribution of light on the image plane of the projection optical system 40. Result of measurement performed by the measurement unit 60 is output to the control unit 80.

Figure 7:
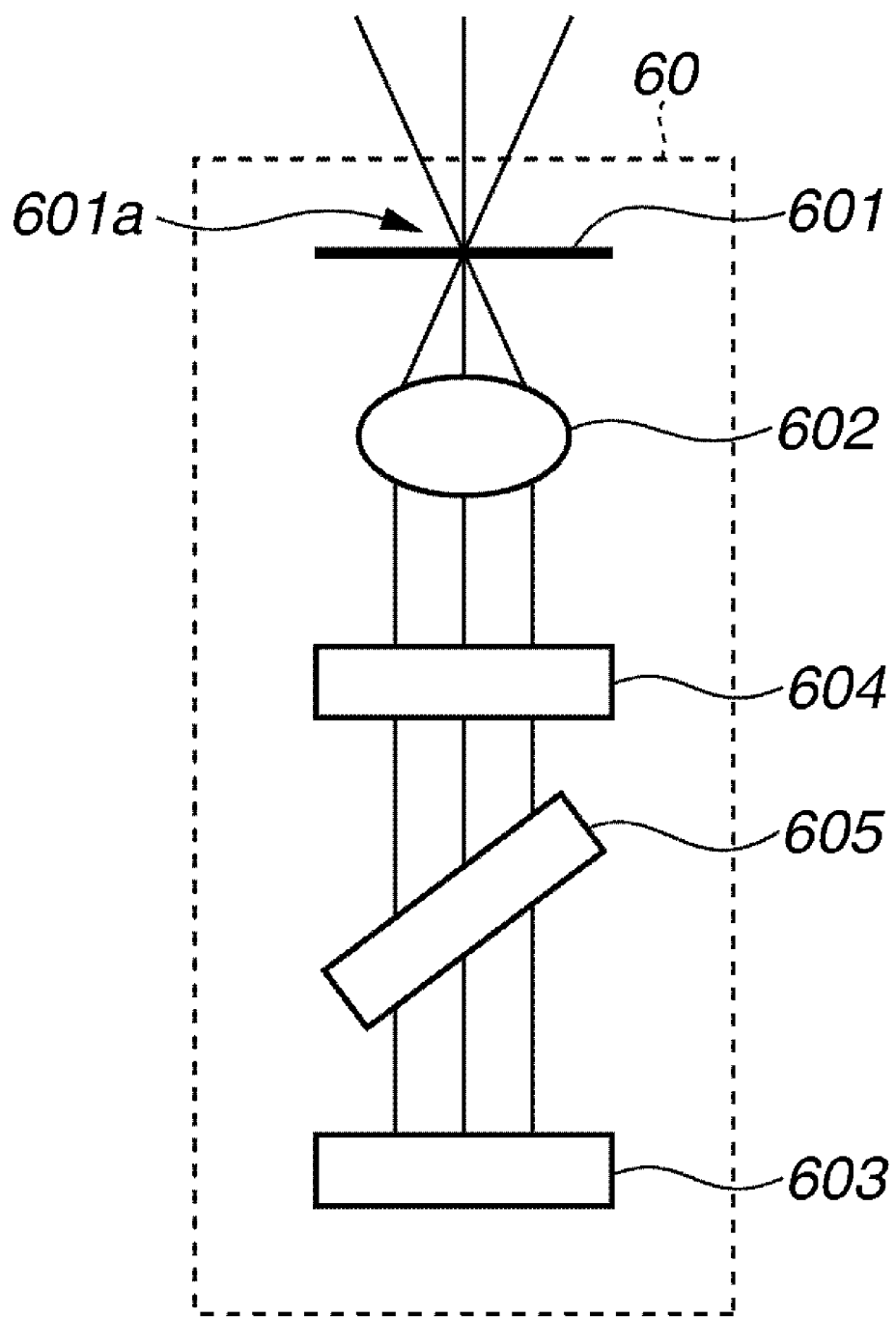
FIG. 7 illustrates an example of a cross section of a measurement unit of the exposure apparatus illustrated in FIG. 1.

FIG. 7 illustrates a cross section of a configuration example of the measurement unit 60. As illustrated in FIG. 7, the measurement unit 60 includes a pinhole plate 601, a Fourier transform lens 602, a light-sensitive element 603, a retarder 604, and a polarizing element 605.

The pinhole plate 601 includes a pinhole 601a on an imaging plane (image plane) of the projection optical system 40. The Fourier transform lens 602 converts light that has passed through the pinhole 601a into approximately parallel light.

The light-sensitive element 603 includes, for example, a two-dimensional image detection element array (charge-coupled device (CCD) or the like) and receives light that has passed through the pinhole 601a. The retarder 604 is located between the pinhole plate 601 and the light-sensitive element 603. The retarder 604 introduces a phase shift into the incident light before the light exits. The polarizing element 605 is located between the retarder 604 and the light-sensitive element 603. Transmittance of the polarizing element 605 depends on the polarization state of the light.

Referring to FIG. 7, light that has passed through the pinhole 601a of the pinhole plate 601 is converted into approximately parallel light by the Fourier transform lens 602. Light that has passed through the Fourier transform lens 602 forms a light intensity distribution on the pupil plane of the projection optical system 40. The light intensity distribution is detected by the light-sensitive element 603.

The light intensity distribution detected by the light-sensitive element 603 is measured as a function of amplitudes Ex and Ey and a phase difference δ. Since this function includes three unknown parameters (amplitudes Ex and Ey, and phase difference δ), the light intensity distribution needs to be measured according to three or more independent polarization states in measuring the polarization state of incident light.

Three or more independent polarization states can be realized by arranging three retarders 604, which provide different phase differences to transmitted light, on a plate. By sliding the plate and changing the retarder in the optical path, three or more independent polarization states can be realized. Further, if the retarder 604 is rotatable, three or more independent polarization states can be realized by rotating it so that it takes three or more angles of rotation.

Additionally, by arranging the retarder 604 to include two wave plates (i.e., a λ/2 wave plate and a λ/4 wave plate) each of which is rotatable, three or more independent polarization states can be realized. Furthermore, by arranging a photoelastic modulator (PEM) in the retarder 604 and applying three or more stresses, three or more phase differences can be realized in the polarization state of transmitted light and, thus, three or more independent polarization states can be realized. It is known that, in order to uniformly apply a stress to a member that is used in the PEM and that exhibits stress birefringence, the member is resonated to generate phase modulation. Further, the PEM needs to be arranged so that it is rotated a predetermined angle in the optical path. Thus, by applying a constant stress to the member and rotating the PEM so that it is rotated three or more angles, three or more independent polarization states can be realized.

The polarizing element 605 includes a parallel-plate polarizer discussed in Japanese Patent No. 3288976 (U.S. Pat. No. 6,977,774), a parallel-plate polarizing beam splitter, which is arranged such that its incident angle is near Brewster's angle, or a prism polarizing beam splitter. Although the polarizing element 605 is fixed according to the present exemplary embodiment, the polarizing element 605 can be configured to be rotatable. The retarder 604 and the polarizing element 605 can be arranged in the optical path where the incident light is parallel light.

The reading unit 70 reads the reticle information 32, which indicates information on the pattern formed on the reticle 30, and sends the information to the control unit 80. According to the present exemplary embodiment, since the reticle information 32 is presented on the reticle 30 as a bar code, the reading unit 70 is configured as a bar code reader. The reading unit 70 can be configured according to the form of the reticle information 32.

The control unit 80, which includes a central processing unit (CPU) and a memory (storage device), controls operation of the exposure apparatus 1. According to the present exemplary embodiment, the control unit 80 controls the measurement unit 60 to measure light that has passed through the illumination optical system 20, the reticle 30, and the projection optical system 40 in a state where the reticle 30 is located between the illumination optical system 20 and the projection optical system 40. More specifically, the control unit 80 instructs the reticle stage 35 to position the reticle 30 and instructs the measurement unit 60 to perform the measurement after the reticle 30 is positioned.

Further, the control unit 80 controls the λ/2 waveplate 201 and the phase plate 203 based on the measurement result obtained by the measurement unit 60 and adjusts the polarization state in the exposure apparatus 1 according to each pattern formed on the reticle 30. Similarly, the control unit 80 controls the beam shaping optical system 202 based on a result of measurement obtained by the measurement unit 60 and adjusts a light intensity distribution on the pupil plane of the projection optical system 40 according to each pattern formed on the reticle 30.

The determination unit 90 is electrically connected to the control unit 80. Based on the reticle information 32 read by the reading unit 70, the determination unit 90 determines a detection object area of the pattern area on the reticle 30. Further, the determination unit 90 calculates or determines a distribution area of diffracted light (hereinafter referred to as "diffracted light determination area") from the detection object area. The determination unit 90 can include an input unit 92, which allows an operator to input information concerning the detection object area. The input unit 92 includes a keyboard, a mouse, and a touch panel. The input 92 is configured to allow an operator to input information similar to the aforementioned reticle information 32.

Figure 8:
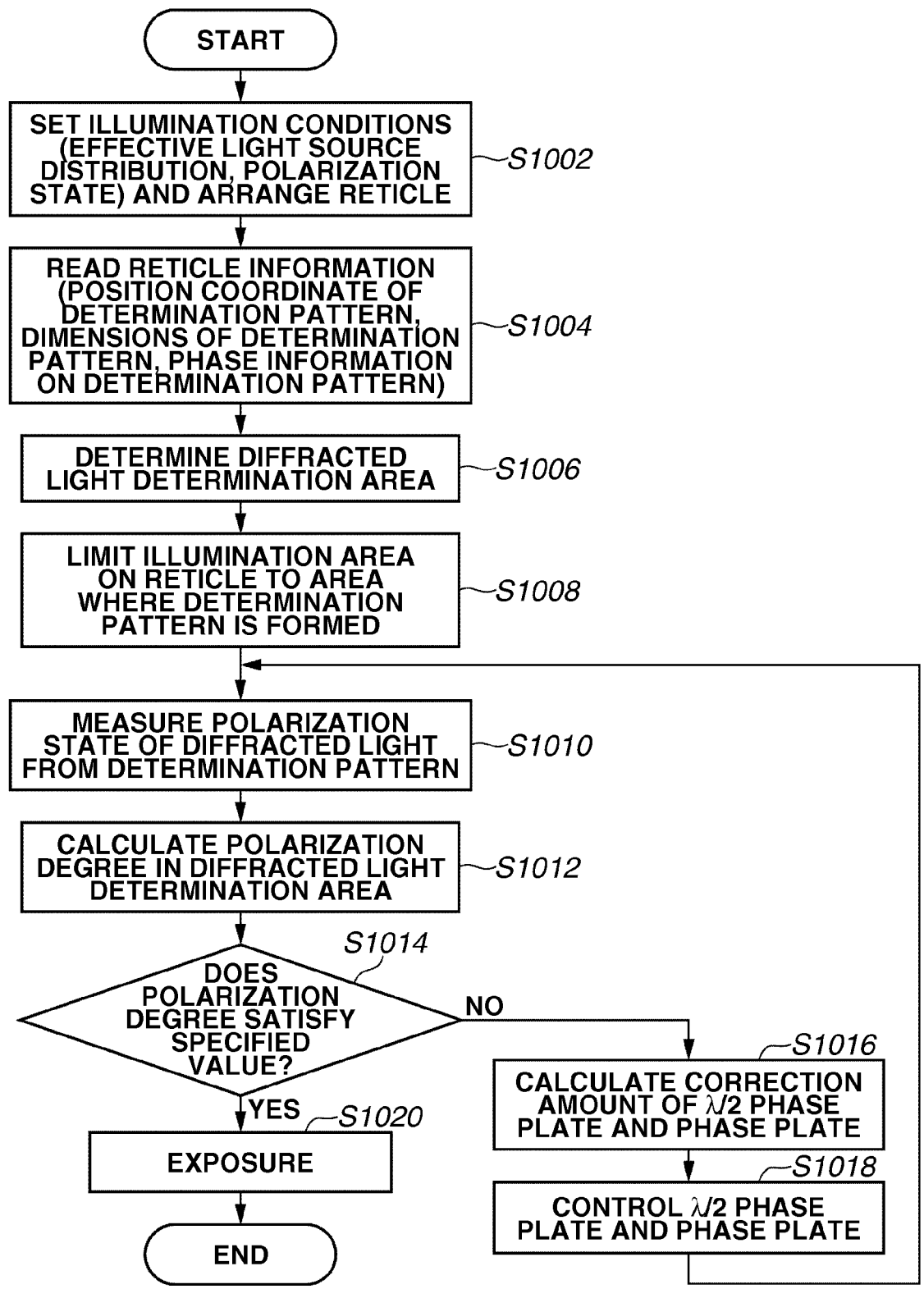
FIG. 8 is a flowchart illustrating adjustment and exposure methods according to an exemplary embodiment of the present invention.

Next, an adjustment method for the illumination condition and an exposure method using the exposure apparatus 1 will be described with reference to FIG. 8. FIG. 8 is a flowchart illustrating an adjustment method and an exposure method according to an exemplary embodiment of the present invention.

First, in step S1002, the control unit 80 sets illumination conditions or lighting mode of the illumination optical system 20 based on an exposure condition given to the exposure apparatus 1 and arranges the reticle 30 on the reticle stage 35. The exposure condition includes, for example, illumination conditions, such as an effective light source and a polarization state, and the reticle 30 to be used. The illumination conditions of the illumination optical system 20 can be set by controlling or driving the λ/2 waveplate 201, the beam shaping optical system 202, and the phase plate 203 as described above.

Figure 9:
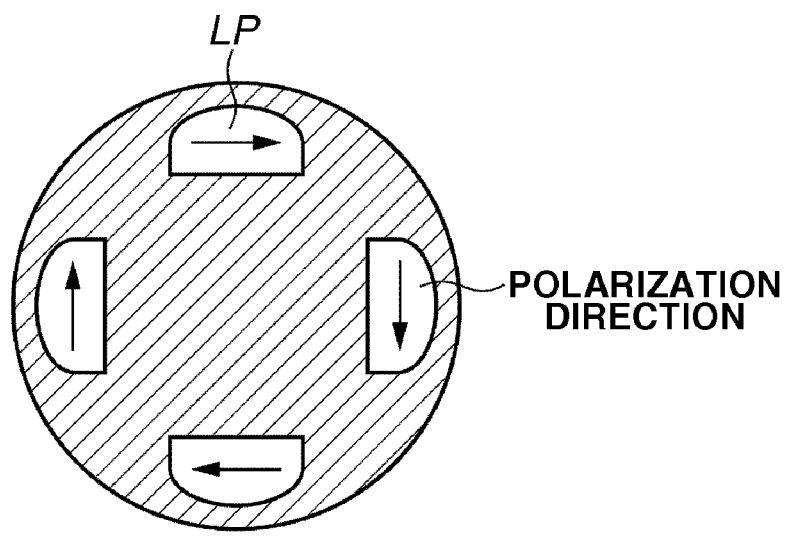
FIG. 9 illustrates an example of an illumination condition (e.g., effective light source distribution and polarization state) of the exposure apparatus illustrated in FIG. 1.

The illumination conditions in the present exemplary embodiment include, for example, an effective light source distribution and a polarization state illustrated in FIG. 9. The effective light source distribution illustrated in FIG. 9 is quadrupole illumination including light portions LP in four off-axis areas on the pupil plane of the illumination optical system 20. The polarization state illustrated in FIG. 9 is a tangentially-polarized state. The polarization degree of the illumination optical system 20 is optimized (0.95 or more according to the present exemplary embodiment). The polarization degree is defined as a proportion of light quantity of main polarization component to total light quantity. The main polarization component is a desired polarization component. If a polarization component perpendicular to the main polarization component, which is an unnecessary polarization component, is defined as a sub-polarization component. If the polarization degree is 1, then the ratio of light quantity between the main polarization component and the sub-polarization component is 1:0. Further, if the polarization degree is 0.5, then the light quantity ratio between the main polarization component and the sub-polarization component is 1:1.

Figure 10:
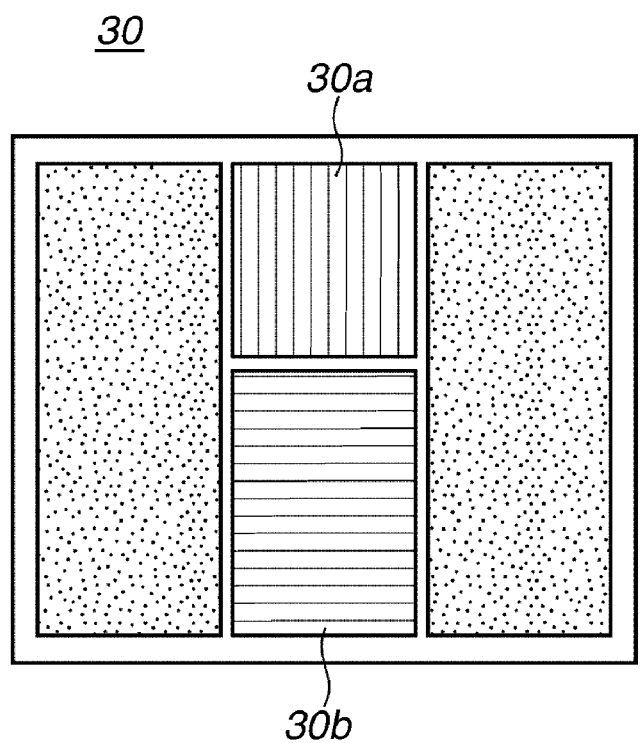
FIG. 10 illustrates an example of a reticle used in the exposure apparatus illustrated in FIG. 1.

The reticle 30 used in the present exemplary embodiment is the Att-PSM or a binary mask illustrated in FIG. 10. Various patterns (e.g., repetitive patterns in the X and Y directions) are formed on the reticle 30. FIG. 10 illustrates an example of the reticle 30 used in the exposure apparatus 1.

Next, in step S1004, the reading unit 70 reads the reticle information 32 on the reticle 30. The reticle information 32 is, as described above, information on the pattern formed on the reticle 30 and is a database of design values (e.g., GDS data) or actual measurement values. The reticle information 32 includes information necessary in performing polarized illumination on the reticle 30. In other words, the reticle information includes information necessary in optimizing the polarization state of the exposure apparatus 1 as a whole.

The reticle information includes the position coordinate of a pattern used for determining the detection object area in the pattern area of the reticle 30. Further, the reticle information 32 includes the dimension (line-and-space width) of the determination pattern or phase information of the determination pattern. It is useful to set a pattern (critical pattern) that requires the highest image quality of all patterns as the determination pattern. According to the present exemplary embodiment, the vertical pattern 30a formed on the reticle 30 illustrated in FIG. 10 is set as the determination pattern.

Next, in step S1006, the determination unit 90 determines the determination pattern as a test object area based on the reticle information 32 read by the reading unit 70 and calculates and determines a diffracted light determination area in which diffracted light from the determination pattern is distributed.

More specifically, the determination unit 90 determines the diffracted light determination area by calculating the light intensity distribution on the pupil plane of the projection optical system 40, which corresponds to the Fourier transform plane of the determination pattern, based on the effective light source distribution, obtained in advance from testing or design simulation, and the reticle information 32. Further, a determination area on the pupil plane of the projection optical system 40 (i.e., diffracted light determination area) can be calculated so that an image contrast on the wafer 50 with respect to the determination pattern satisfies a predetermined level. Although the diffracted light determination area is calculated or determined based on the reticle information 32 according to the present exemplary embodiment, the diffracted light determination area can be included in the reticle information 32.

The diffracted light determination area is an area on which light that contributes to forming an image of the pattern formed on the reticle 30 mainly exists. In other words, the diffracted light determination area is an area that corresponds to the detection object area. Thus, the resolution power of the exposure apparatus 1 can be improved by controlling the polarization state in the diffracted light determination area. Further, an image forming performance for a pattern that is required for the highest imaging quality of all of the patterns formed on the reticle 30 can be improved by controlling the beam shaping optical system 202 such that diffracted light from the determination pattern exits in the diffracted light determination area.

Next, in step S1008, the control unit 80 drives the masking blade 206 and limits the illumination area on the reticle 30, which is to be illuminated by the illumination optical system 20, only to an area where the determination pattern is formed. This is because, in measuring a polarization state of diffracted light from a specified area, such as a determination pattern, it is useful that only the specified area is illuminated.

Next, in step S1010, the measurement unit 60 measures the polarization state of diffracted light from the determination pattern (the vertical pattern 30a on the reticle 30 illustrated in FIG. 10). More specifically, the vertical pattern 30a on the reticle 30 illustrated in FIG. 10 is illuminated under the illumination condition illustrated in FIG. 9, and diffracted light from the vertical pattern 30a is measured by the measurement unit 60. The measurement unit 60 is located at a position where it can measure diffracted light from the vertical pattern 30a through the wafer stage 55.

Figure 11:
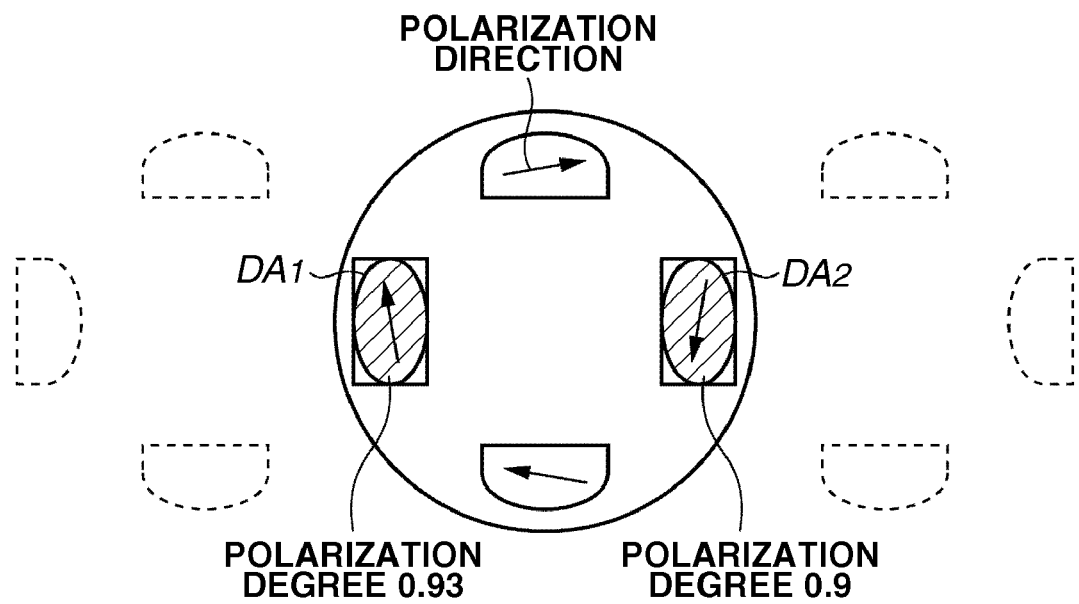
FIG. 11 illustrates an example of a polarization degree in a diffracted light determination area, which is calculated based on a polarization state of diffracted light from a determination pattern.

Next, in step S1012, the control unit 80 calculates the polarization degree in the diffracted light determination area based on the polarization state of diffracted light from the determination pattern measured by the measurement unit 60. FIG. 11 illustrates an example of a result of calculation of the polarization degree in the diffracted light determination area based on the polarization state of diffracted light from the determination pattern. Areas DA1 and DA2 in FIG. 11 are diffracted light determination areas. The polarization degree in the diffracted light determination area DA1 is calculated as 0.93 and the polarization degree in the diffracted light determination area DA2 is calculated as 0.9.

Next, in step S1014, the control unit 80 determines whether the polarization degree in the diffracted light determination area is in an optimum level, in other words, whether the polarization degree satisfies a specified value. According to the present exemplary embodiment, the optimum polarization degree is 0.95 or more. If the polarization degree in the diffracted light determination area satisfies the specified threshold value (i.e., the polarization degree is 0.95 or more) (YES in step S1014), then in step S1020, the control unit 80 exposes the wafer 50 with the pattern formed on the reticle 30.

On the other hand, if the polarization degree in the diffracted light determination area does not satisfy the specified value (NO in step S1014), then in steps S1016 and S1018, the control unit 80 controls the λ/2 waveplate 201 and the phase plate 203 such that the polarization degree in the diffracted light determination area satisfies the specified value.

More specifically, in step S1016, the control unit 80 calculates a correction amount of the λ/2 waveplate 201 and the phase plate 203 necessary in satisfying the specified value of the polarization degree in the diffracted light determination area. The correction amount includes, for example, amounts of rotational correction, drive correction, and positional correction of the λ/2 waveplate 201 and the phase plate 203.

Next, in step S1018, the control unit 80 controls the λ/2 waveplate 201 and the phase plate 203 based on the correction amount calculated in step S1016. When the control operation for the λ/2 waveplate 201 and the phase plate 203 is completed, the process returns to step S1010 to confirm whether the polarization degree in the diffracted light determination area satisfies the specified value.

Since the polarization degree in the diffracted light determination area DA1 is calculated as 0.93 and the polarization degree in the diffracted light determination area DA2 is calculated as 0.9 in step S1012 according to the present exemplary embodiment, the polarization degree does not satisfy the above-described specified value. This is caused by a change in the polarization state due to, for example, birefringence of the optical system subsequent to the pupil plane of the illumination optical system 20 and the reticle 30. Accordingly, the control unit 80 controls the λ/2 waveplate 201 and the phase plate 203 such that the polarization degree in the diffracted light determination areas DA1 and DA2 becomes 0.95 or more. Although the polarization state on the pupil plane of the illumination optical system 20 is changed from the polarization state illustrated in FIG. 9, the polarization degree in the diffracted light determination area, which contributes to the image formation of the pattern, is improved, and the polarization state in the exposure apparatus 1 as a whole is optimized.

It is to be noted that even if steps S1004 through S1008 are not performed, in a state where the reticle 30 is located on an object plane of the projection optical system 40, the measurement unit 60 can measure the polarization state of diffracted light from an arbitrary area (position) of the reticle 30. In this way, according to the exposure apparatus 1, a polarization state under an actual exposure condition can be measured and, thus, the polarization state (illumination condition) can be adjusted to the optimum polarization state in the exposure apparatus 1 as a whole.

Although the polarization degree is used in expressing the polarization state on the pupil plane of the projection optical system 40 according to the present exemplary embodiment, other methods for expressing phase information and amplitude information can also be used. For example, if the polarization state is measured as a Mueller matrix, light can be measured by switching the polarization state of the light among linear polarization in the X direction, linear polarization in the Y direction, linear polarization in the 45-degrees direction, and circular polarization.

If a plurality of position coordinates exist for the determination pattern (for example, if the vertical pattern 30a occupies a certain amount of area and a plurality of points are necessary as sampling points), a plurality of diffracted light determination areas corresponding to the plurality of position coordinates are calculated. Then, the polarization degrees in the plurality of diffracted light determination areas are calculated, and the polarization degrees can be adjusted such that a mean value of the polarization degrees satisfies the specified value.

The critical pattern is preferably set as the determination pattern as described above. However, the determination pattern can be arranged such that its setting is changeable and the actual exposure result can be reflected to the setting. Further, the vertical pattern 30a can be set as a first determination pattern and a horizontal pattern 30b can be set as a second determination pattern. In this case, the optimum polarization degree or specified value can be set respectively. For example, the polarization degree of the diffracted light determination area corresponding to the first determination pattern can be set to 0.95 or more, and the polarization degree of the diffracted light determination area corresponding to the second determination pattern can be set to 0.9 or more.

A resolution R provided by a projection exposure apparatus is given by the following equation, where the wavelength of the light source is $\lambda$, the numerical aperture of a projection optical system is NA, and a constant determined by the development process is k1.

$$R = k1(\lambda/NA)$$

The resolution R can be improved by decreasing the wavelength $\lambda$ of the light source, increasing the NA of the projection optical system, or decreasing the constant k1. In particular, the process using polarized illumination is effective when the NA of the projection optical system is 0.7 or more and the constant k1 is 0.25 or more but does not exceed 0.5. If the constant k1 is 0.25 or more but does not exceed 0.5, light that contributes to image formation out of the light that has passed through the projection optical system is light existing in 50 percent or more but not exceeding 100 percent of the area with respect to the numerical aperture (NA). Accordingly, the diffracted light determination area is preferably 50 percent or more but not exceeding 100 percent of the area with respect to the numerical aperture (NA) of the projection optical system 40.

If the diffracted light determination area is $\alpha$ percent or more but not exceeding 100 percent of the area with respect to the numerical aperture (NA) of the projection optical system 40, then a light quantity detection element other than a two-dimensional image detection element can be used as the light-sensitive element 603 in the measurement unit 60. In this case, an aperture stop used for extracting light existing in the area of $\alpha$ percent or more but not exceeding 100 percent with respect to the numerical aperture (NA) of the projection optical system 40 is located between the Fourier transform lens 602 and the light quantity detection element. An optimum value of the value a is determined based on the pattern on the reticle 30 and the illumination condition. However, according to polarized illumination, the value $\alpha$ is preferably set as $5 \leq \alpha \leq 10$.

Further, the influence of stress birefringence on the polarization state when the reticle 30 is held can be confirmed by measuring light that has passed through an area of the reticle 30 on which no pattern is formed.

Figure 12:
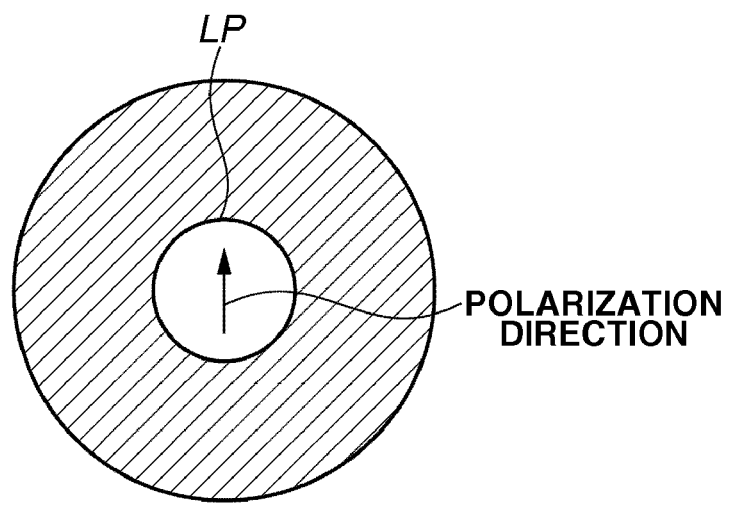
FIG. 12 illustrates an example of an illumination condition (effective light source distribution and polarization state) of the exposure apparatus illustrated in FIG. 1.

It is to be noted that various exposure conditions can be applied to the exposure apparatus 1. For example, the effective light source distribution and the polarization state illustrated in FIG. 12 can be applied as illumination conditions of the exposure apparatus 1. The effective light source distribution illustrated in FIG. 12 is Y-polarized small σ illumination having an on-axis light portion LP on the pupil plane of the illumination optical system 20. Further, the reticle 30 is an Alt-PSM as illustrated in FIG. 13 with a repetitive pattern 30c formed in the X direction.

Figure 13:
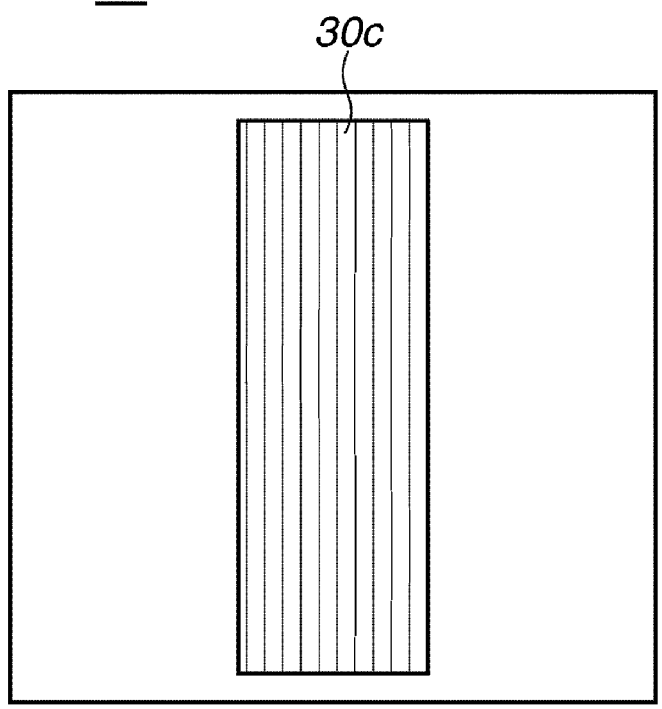
FIG. 13 illustrates an example of a reticle used in the exposure apparatus illustrated in FIG. 1.
Figure 14:
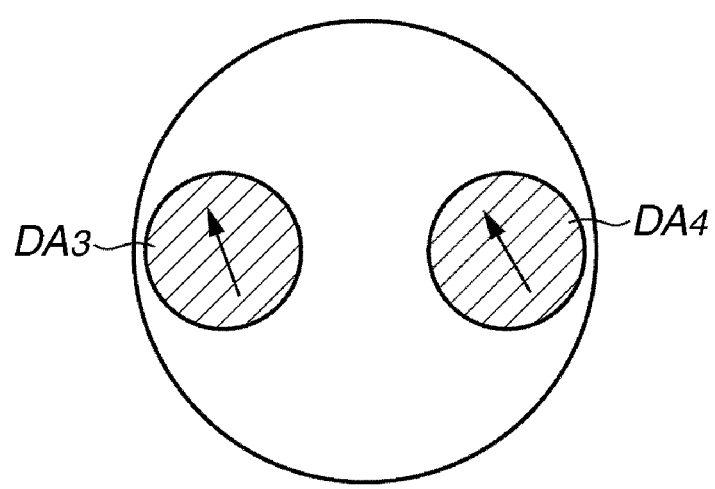
FIG. 14 illustrates an example of a calculation result of a polarization degree in a diffracted light determination area based on a polarization state of diffracted light from a determination pattern.

FIG. 14 illustrates a polarization degree in the diffracted light determination area obtained by illuminating the repetitive pattern 30c formed on the reticle 30 illustrated in FIG. 13 under the illumination condition illustrated in FIG. 12, measuring the polarization state of diffracted light from the repetitive pattern 30c, and calculating the polarization degree. If the polarization degree in the diffracted light determination areas DA3 and DA4 is not optimum (i.e., does not satisfy the specified value), the polarization state on the pupil plane of the illumination optical system 20 is adjusted such that the polarization degree in the diffracted light determination areas DA3 and DA4 is optimized as described above. However, since the illumination condition is Y-polarized small σ illumination, the polarization state in the diffracted light determination area is adjusted only by the control of the $\lambda/2$ waveplate 201, and the phase plate 203 is removed from the optical path of the illumination optical system 20.

Diffracted light from the pattern of the reticle 30 depends on the illumination light (effective light source distribution). Thus, in order to obtain enhanced image quality, it is useful that diffracted light that contributes to image formation is adjusted (controlled) such that the diffracted light is appropriately distributed on the pupil plane of the projection optical system 40. As illustrated in FIG. 15, the exposure apparatus 1 is capable of adjusting the effective light source distribution (i.e. effective light source distribution on the pupil plane of the projection optical system 40) in the diffracted light determination area in an optimum state by determining the diffracted light determination area. FIG. 15 is a flowchart illustrating an exposure method according to an exemplary embodiment of the present invention. Steps S1002 through S1008 are similar to the steps illustrated in the flowchart of FIG. 8. The illumination condition is set and the reticle 30 is arranged in step S1002, and the illumination area on the reticle 30 is limited in step S1008.

Referring to FIG. 15, in step S1010A, the measurement unit 60 measures diffracted light from the determination pattern.

Next, in step S1012A, the control unit 80 calculates the effective light source distribution (light intensity distribution) in the diffracted light determination area based on the diffracted light from the determination pattern measured by the measurement unit 60.

Next, in step S1014A, the control unit 80 determines whether the effective light source distribution in the diffracted light determination area is optimized, in other words, the polarization degree satisfies the specified condition. If the effective light source distribution in the diffracted light determination area satisfies the specified value (YES in step S1014A), then in step S1020, the control unit 80 exposes the wafer 50 with the pattern formed on the reticle 30.

If the effective light source distribution in the diffracted light determination area does not satisfy the specified value (NO in step S1014A), then in steps S1016A and S1018A, the control unit 80 controls the beam shaping optical system 202 such that the effective light source distribution in the diffracted light determination area satisfies the specified value.

More specifically, in step S1016A, the control unit 80 calculates a correction amount for the beam shaping optical system 202 necessary in satisfying the specified value of the effective light source distribution in the diffracted light determination area. Next, in step S1018A, the control unit 80 controls the beam shaping optical system 202 based on the correction amount calculated in step S1016A. When the control of the beam shaping optical system 202 is completed, the process returns to step S1010A to confirm whether the effective light source distribution in the diffracted light determination area satisfies the specified value.

As described above, in the exposure apparatus 1, the effective light source distribution in the diffracted light determination area corresponding to the determination pattern (critical pattern) can be adjusted to an appropriate state. Further, by using the flowcharts illustrated in FIGS. 8 and 15 combined together, the exposure apparatus 1 can adjust the polarization state and the effective light source distribution in the exposure apparatus 1 as a whole.

Next, a method for manufacturing a device, such as a semiconductor IC device or a liquid crystal display element, using the above-described exposure apparatus will be described. The device is manufactured through processes including exposing a substrate (wafer, glass substrate), which is coated with photosensitive material, to light, developing the substrate (photosensitive material), and other known processes including etching, resist stripping, dicing, bonding, and packaging, using the above-described exposure apparatus. According to this device manufacturing method, a device with improved quality can be manufactured.

The reticle according to an exemplary embodiment of the present invention is not limited to an actual reticle on which a circuit pattern is formed and used for transferring a pattern onto a wafer. For example, a test reticle or a dummy reticle, which is used for testing exposure performance of the exposure apparatus, can also be used. When performing exposure using the actual reticle, a reticle having a pattern similar to the pattern of the actual reticle is selected, and light emitted from the light source is adjusted to a polarization state that is appropriate for the selected reticle.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-197849 filed Jul. 30, 2007, which is hereby incorporated by reference herein in its entirety.

What is claimed is:

1. An adjustment method for adjusting an illumination condition in illuminating an original plate using an illumination optical system and projecting an image of a pattern formed on the original plate onto a substrate through a projection optical system, the adjustment method comprising:
    measuring a polarization state of light that has passed through the illumination optical system, the original plate, and the projection optical system in a state where the original plate is located on an object plane of the projection optical system; and
    adjusting the polarization state based on the measured polarization state.

2. The adjustment method according to claim 1, further comprising:
    measuring an angular distribution of light that has passed through the illumination optical system, the original plate, and the projection optical system on an image plane of the projection optical system; and
    adjusting the polarization state and the angular distribution based on the measured polarization state and the measured angular distribution.

3. The adjustment method according to claim 1, further comprising adjusting the polarization state according to the pattern formed on the original plate.

4. An exposure method comprising:
    adjusting a polarization state using an adjustment method for adjusting an illumination condition in illuminating an original plate using an illumination optical system and projecting an image of a pattern formed on the original plate onto a substrate through a projection optical system, the adjustment method including,
    measuring a polarization state of light that has passed through the illumination optical system, the original plate, and the projection optical system in a state where the original plate is located on an object plane of the projection optical system; and
    adjusting the polarization state based on the measured polarization state; and
    exposing the substrate to light by projecting the pattern formed on the original plate onto the substrate after adjusting the polarization state.

5. A manufacturing method for manufacturing a device, the manufacturing method comprising:
    exposing a substrate to light using an exposure method including,
    adjusting a polarization state using an adjustment method for adjusting an illumination condition in illuminating an original plate using an illumination optical system and projecting an image of a pattern formed on the original plate onto the substrate through a projection optical system, the adjustment method including,
    measuring a polarization state of light that has passed through the illumination optical system, the original plate, and the projection optical system in a state where the original plate is located on an object plane of the projection optical system; and adjusting the polarization state based on the measured polarization state; and exposing the substrate to light by projecting the pattern formed on the original plate onto the substrate after adjusting the polarization state; and developing the exposed substrate.

6. An adjustment method for adjusting an illumination condition in illuminating an original plate using an illumination optical system and projecting an image of a pattern formed on the original plate onto a substrate through a projection optical system, the adjustment method comprising:

determining an object area of the pattern formed on the original plate;

measuring a polarization state and an angular distribution of light that has passed through the illumination optical system, the object area of the original plate, and the projection optical system on an image plane of the projection optical system in a state where the original plate is located on an object plane of the projection optical system; and adjusting the polarization state and the angular distribution based on the measured polarization state and the measured angular distribution.

7. The adjustment method according to claim 6, further comprising adjusting the polarization state and the angular distribution according to the pattern formed on the original plate.

8. An exposure method comprising:

adjusting the polarization state and the angular distribution using the adjustment method according to claim 6; and exposing the substrate to light by projecting the pattern formed on the original plate onto the substrate after the adjusting step.

9. A manufacturing method for manufacturing a device, the manufacturing method comprising:

exposing the substrate to light using the exposure method according to claim 8; and developing the exposed substrate.

* * * * *